United States Patent [19]

Yamada

[11] Patent Number: 5,466,549
[45] Date of Patent: Nov. 14, 1995

[54] METHOD OF DETECTING AND ADJUSTING EXPOSURE CONDITIONS OF CHARGED PARTICLE EXPOSURE SYSTEM

[75] Inventor: Akio Yamada, Kawasaki, Japan

[73] Assignee: Fujitsu Limited, Kanagawa, Japan

[21] Appl. No.: 43,941

[22] Filed: Apr. 5, 1993

Related U.S. Application Data

[63] Continuation of Ser. No. 621,811, Dec. 4, 1990, abandoned.

[30] Foreign Application Priority Data

Dec. 4, 1989 [JP] Japan ..................... 1-313443

[51] Int. Cl.$^6$ ............................... G03F 7/20; H01J 37/30
[52] U.S. Cl. .................. 430/30; 430/296; 430/942; 250/492.3
[58] Field of Search ........................ 430/30, 296, 942; 250/491.1, 492.1, 492.2, 493.3

[56] References Cited

U.S. PATENT DOCUMENTS

| | | | |
|---|---|---|---|
| 4,334,156 | 6/1982 | Bohlen | 250/491 |
| 4,577,111 | 3/1986 | Saitou et al. | 250/492.2 |
| 4,859,857 | 8/1989 | Stengl | 250/492.3 |
| 4,985,634 | 1/1991 | Stengl et al. | 430/30 |

FOREIGN PATENT DOCUMENTS

367126  5/1990  European Pat. Off. ............... 430/30

*Primary Examiner*—Kathleen Duda
*Attorney, Agent, or Firm*—Staas & Halsey

[57] ABSTRACT

A charged particle exposure system comprises an electron gun, an irradiation optical system, an incident mask deflector, a stencil mask, an irradiation mask provided on an incident side of the deflector, a reduction optical system, and a stage. The stencil mask has a group of normal patterns and at least two mark patterns. Images of the mark patterns are transferred onto the surface of a sample on the stage. A reduction ratio and rotational angle of the transferred images are computed according to a distance between the images, positional relations of the images, a known distance between the mark patterns on the stencil mask, and known positional relations of the mark patterns on the stencil mask. Based on the computed reduction ratio and rotational angle, exposure conditions of the exposure system are adjusted.

6 Claims, 9 Drawing Sheets

METHOD OF DETECTING AND ADJUSTING EXPOSURE CONDITIONS OF CHARGED PARTICLE EXPOSURE SYSTEM

This application is a continuation of application Ser. No. 07/621,811, filed Dec. 4, 1990, now abandoned.

BACKGROUND OF THE INVENTION

1. Field of the Invention

The present invention relates to a method of detecting and adjusting exposure conditions of a charged particle exposure system that forms fine patterns on a substrate with electron beams.

2. Description of the Related Art

High integration of integrated circuits in recent years has replaced photolithography that has been a main method of forming fine patterns, with a new exposure method employing electron beams.

A conventional electron beam exposure system deflects a variable rectangular beam to scan a sample wafer and draw a pattern on the wafer with the beam. The exposure system draws a pattern by connecting rectangular exposure shots to one another. The number of exposure shots per unit area becomes larger if the size of each shot is small, and if the number is large, throughput may decrease. To achieve practical throughput in exposing very fine patterns, a block exposure method is employed. This method will be explained.

A semiconductor device such as a 64-M DRAM that comprises very fine patterns is usually made up of repetition of several basic patterns. If each of the basic patterns is formed by one irradiation exposure regardless of its complexity, very fine patterns may be formed at acceptable throughput. To realize this, the block exposure method employs a transmission mask (a stencil mask) on which the basic patterns are formed. By applying an electron beam to the transmission mask, each basic pattern is formed on a sample in one irradiation exposure. This operation is repeated so that connected basic patterns may be formed on the sample.

An example of this method is reported in "IEEE TRANS. ON ELECTRON DEVICES," Vol. ED-26 (1979) 663, and FIG. 3 shows a basic arrangement of the example.

Figure 3:
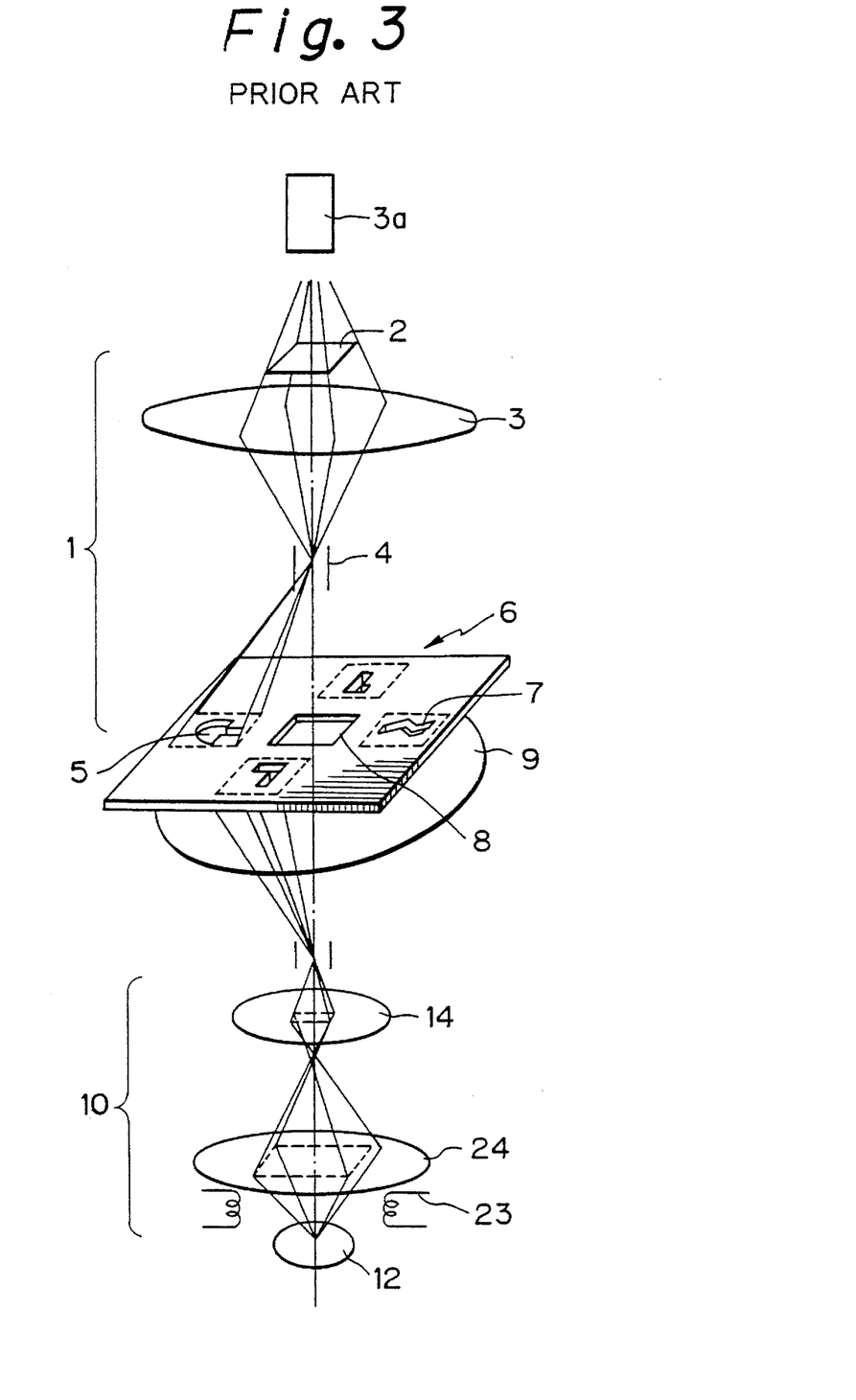
FIG. 3 is a view showing a charged particle exposure system according to a prior art.

In FIG. 3, an electron gun 3a emits an electron beam, which passes through an irradiation optical system 1 comprising a first rectangular aperture 2 and a lens 3. A pattern selecting deflector 4 positioned at a crossover image point deflects the electron beam, which then irradiates an optional pattern 5 formed on a stencil mask 6. The pattern 5 of the stencil mask 6 forms the electron beam into a patterned electron beam. A lens 9 converges the patterned electron beam to an optical axis. A reduction lens 14 reduces the cross section of the beam. The beam passes through a projection lens 24 and deflecting systems 23, and exposes a wafer 12.

According to this method, the electron beam deflected from the optical axis is returned to the optical axis only by a converging action of the lens 9, and the electron beam passes through a different part of the lens 9 depending on a selected pattern of the stencil mask 6. To arrange as many patterns as possible on the stencil mask 6, an electron beam is required to pass through the lens 9 as far away as possible from the optical axis thereof. Lens aberration existing in this arrangement, however, seriously influences a transferred image. To cope with this problem, the inventors have once proposed an electron beam exposure system of FIG. 4.

Figure 4:
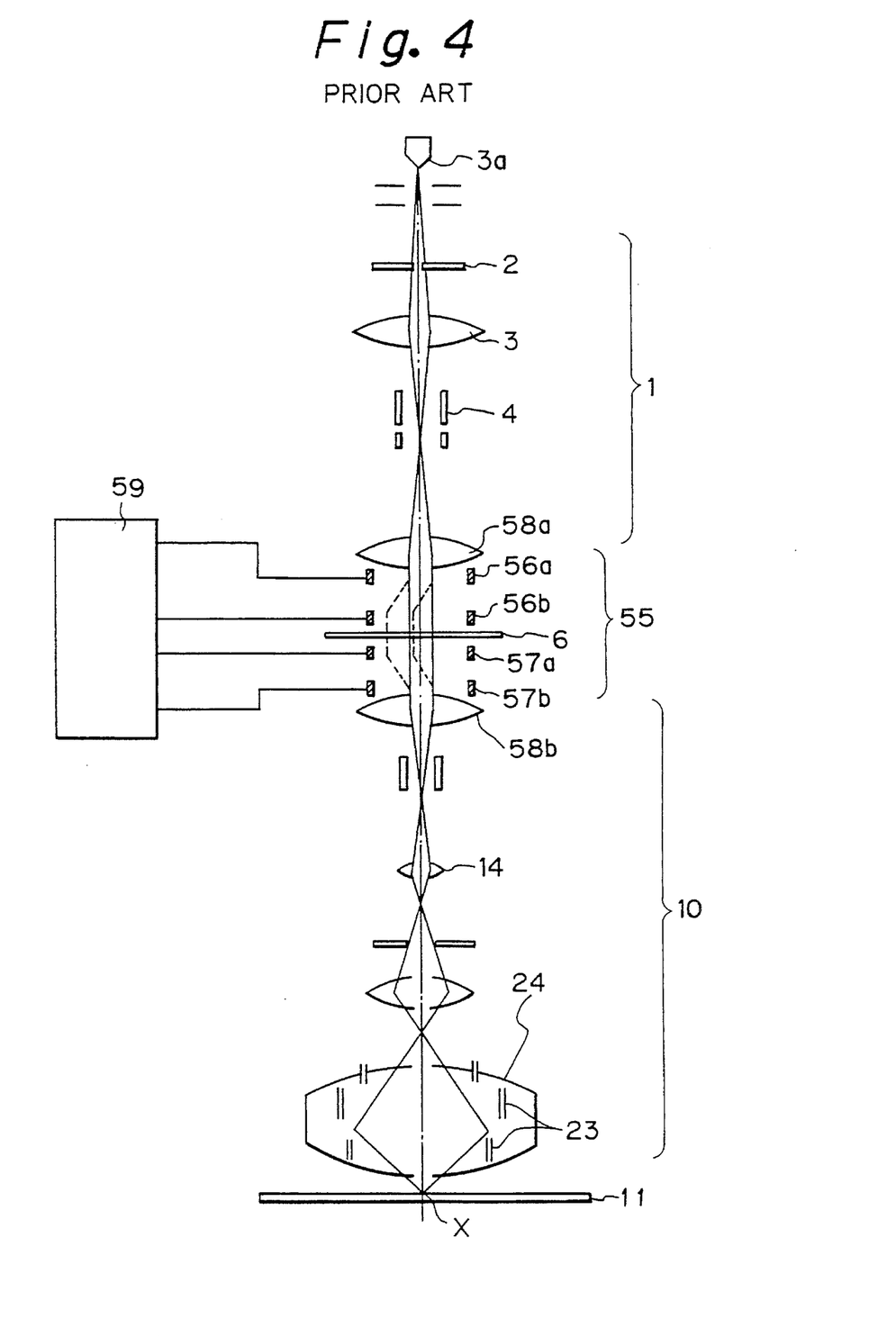
FIG. 4 is a view showing a charged particle exposure system according to another prior art.

In FIG. 4, an irradiation optical system 1 comprises a first rectangular aperture 2, a first lens 3, a deflector 4, and a second lens 58a. A mask deflector 56 is disposed on the incident side to deflect an electron beam toward a required pattern 7 among a group of patterns formed on a stencil mask 6. A mask deflector 57 is disposed on the irradiation side to return the electron beam passed through the stencil mask 6 to an original optical axis. The mask deflectors 56 and 57 form a deflector 55. A reduction optical system 10 comprises a lens 58b, a reduction lens 14, a projection lens 24, a deflector 23, etc. A movable stage 11 carries a substrate such as a wafer which is irradiated with the electron beam. A mask deflector driving unit 59 drives the deflector 55 according to processed data.

The aperture pattern selecting deflectors 56a, 56b, 57a, and 57b deflect an electron beam toward a pattern formed on the stencil mask 6, and return the electron beam to the optical axis under the stencil mask 6. With this arrangement, an electron beam for selecting a mask pattern passes through the centers of the lenses 58a and 58b.

Figure 5:
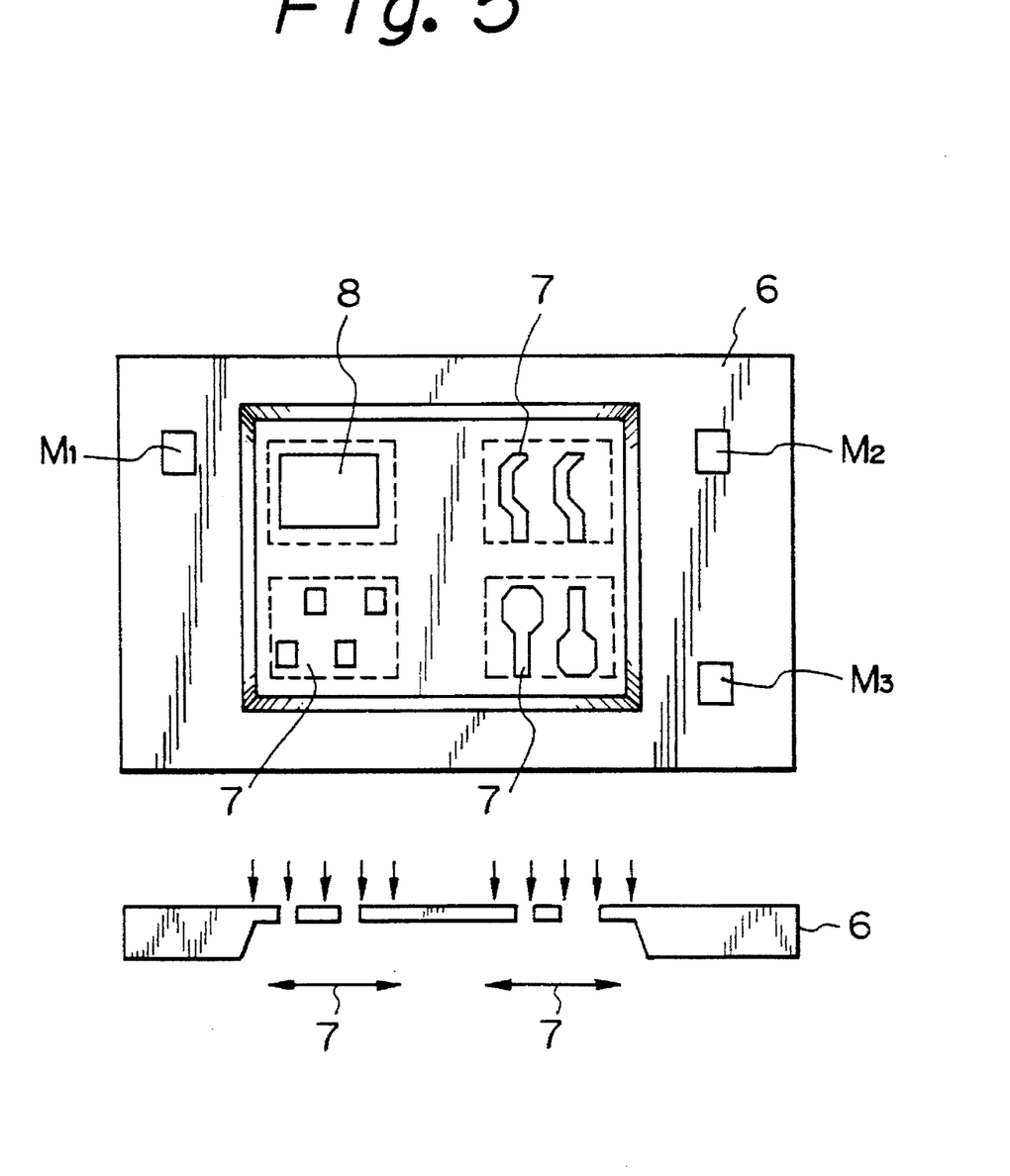
FIG. 5 is a plan view showing a stencil mask.

FIG. 5 shows an example of the stencil mask. As shown in a side view of the figure, a pattern forming part of the stencil mask is thinned. Each pattern is formed by etching. A substrate of the stencil mask is made of semiconductor material such as silicon or a metal plate. On the stencil mask, there are formed a plurality of groups of patterns that are selected by the aperture pattern selecting deflector 55. The pattern groups may be moved relative to an optical axis by an X-Y stage that supports the stencil mask. To load the stencil mask onto the X-Y stage, there is arranged a mask loading subchamber that can be disconnected from a column proper by a gate valve.

In this sort of block pattern transfer electron beam exposure system, the reduction optical system 10 including the reduction lens 14, projection lens 24, etc., determines a reduction ratio (magnitude) in reducing and transferring a pattern on the stencil mask onto the wafer, according to a combination of conditions such as the power of the respective lenses, etc. Reducing an image by the lenses usually causes rotation of the image. This rotation can be adjusted by adjusting conditions of the lenses.

In forming a required combination of patterns on a wafer by continuously irradiating a plurality of the same or different patterns formed on a stencil mask, the respective patterns must be connected to one another correctly and continuously on the wafer. Namely, the image of each pattern formed on the wafer must have the same reduction ratio and rotational angle. To improve an accuracy of the size of each image on the wafer and an accuracy of connecting the images to each other, the reduction ratio and rotational angle must be accurately detected.

To detect the reduction ratio and rotational angle, a rectangular electron beam is applied to the wafer, and a sample stage coordinate measuring system measures the size and orientation of the rectangular beam. The size of the rectangular beam formed on the wafer is usually 3 to 4 $\mu m^2$ or smaller. Beam edge roughness influences measuring accuracy of the size and orientation of the beam. In this way, the conventional measuring system has a limit in its accuracy.

SUMMARY OF THE INVENTION

An object of the present invention is to provide a method of accurately detecting exposure conditions such as a reduction ratio and rotational angle of a pattern that is transferred from a mask to a wafer in a charged particle exposure system, as well as a method of adjusting and establishing optimum exposure conditions of the charged particle exposure system according to the detected reduction ratio and rotational angle.

In order to accomplish the objects, a charged particle exposure system at least comprises an electron gun, an irradiation optical system, an incident mask deflector, a stencil mask, a reduction optical system, and a stage. The stencil mask has a group of normal patterns and at least two mark patterns. According to the present invention, a method of detecting and adjusting exposure conditions of the charged particle exposure system comprises the steps of:

operating the incident mask deflector to apply charged electron beams emitted by the electron gun to each of the mark patterns of the stencil mask;

projecting the electron beams passed through the mark patterns onto the surface of a sample on the stage through the reduction optical system;

computing positional relations of images of the mark patterns projected on the surface of the sample;

comparing the positional relations computed in the preceding step with positional relations of the mark patterns on the stencil mask, and computing a reduction ratio of the images on the surface of the sample or a rotational angle of the images; and calibrating operating conditions of reduction optical system according to the reduction ratio or rotational angle computed in the preceding step, thereby realizing a required reduction ratio or rotational angle.

Figure 1A:
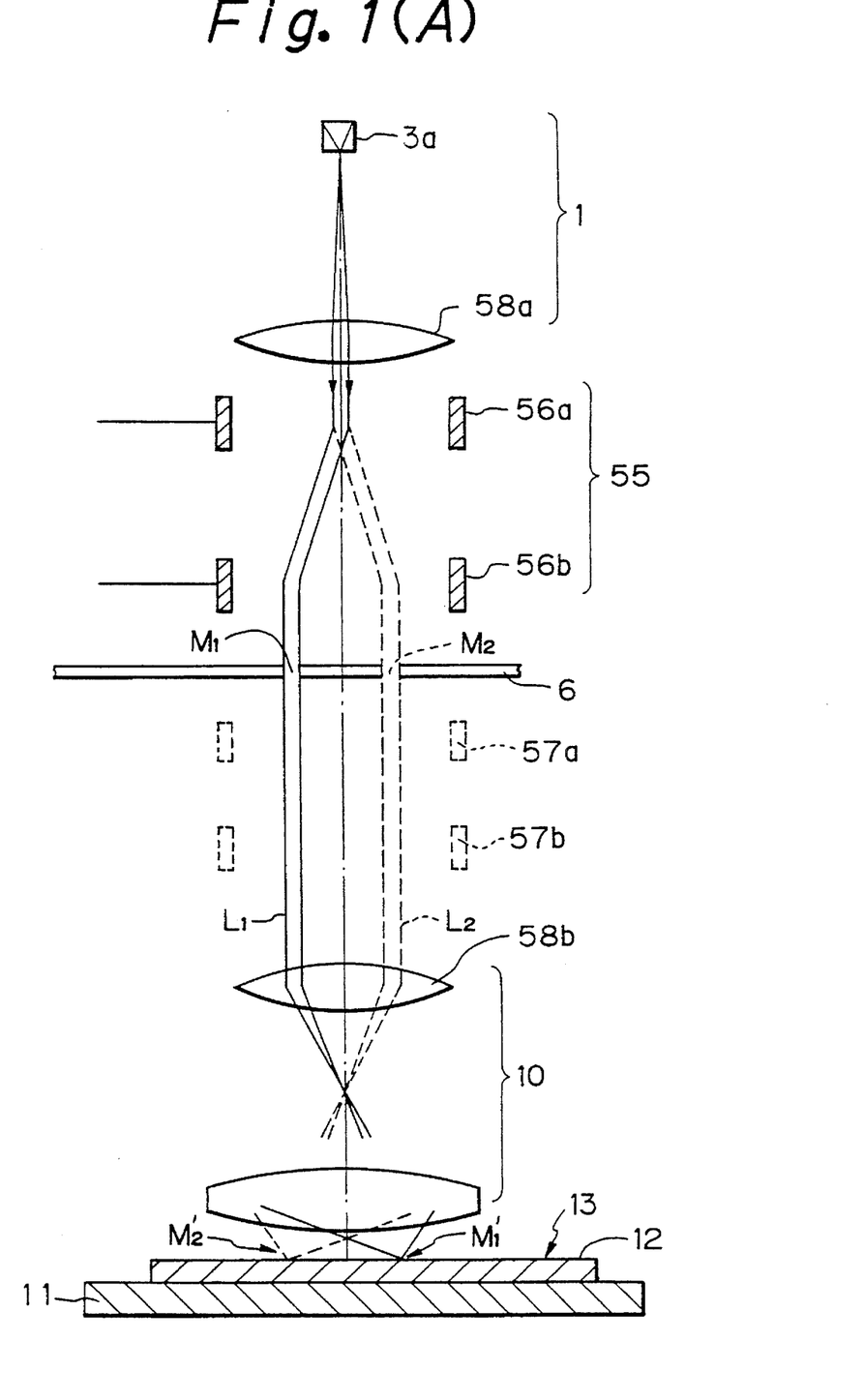
FIG. 1(A) is a view showing a charged particle exposure system employed by the present invention, and a principle of the present invention.

According to the present invention of FIG. 1(A), an aperture pattern selecting deflector 55 comprises incident mask deflectors 56a and 56b located on the electron gun side of a stencil mask 6. The stencil mask 6 has two mark patterns whose positional relations are known. Electron beams passed through the deflectors 56a and 56b and the stencil mask 6 form transferred images of the mark patterns on a sample. According to the positional relations of the transferred images on the sample and the positional relations of the mark patterns on the stencil mask 6, a reduction ratio and rotational angle of the images due to a reduction optical system are correctly detected. The reduction optical system is located on the sample side of the stencil mask 6.

Based on the detected reduction ratio and rotational angle, the deflectors, irradiation optical system, and reduction optical system of the exposure system are calibrated to establish optimum conditions thereof.

DESCRIPTION OF THE PREFERRED EMBODIMENTS

For a better understanding of the preferred embodiments of the present invention, the problems in the prior art will be explained.

A reduction ratio of a reduction lens of an exposure system and a rotational angle of an image must be adjusted to designed values before actually carrying out an electron beam exposure operation by the exposure system. If the exposure system employs a variable rectangular beam, the reduction ratio and rotational angle may be corrected by adjusting the size and orientation of a variable rectangular pattern formed on a mask. Namely, it is not necessary to directly adjust the reduction lens.

If the exposure system employs a block exposure method, however, the size of each pattern formed on a stencil mask is predetermined, so that the reduction lens system must directly be adjusted to adjust its reduction ratio and rotational angle. In this case, an electron beam is applied to a pattern on the stencil mask to form an image of the pattern on the surface of a sample disposed on a stage. The image is compared with a theoretical pattern to find a difference compared between them, and according to the difference, adjusting quantities are computed.

As the reduction ratio becomes greater and as the shape of a mask pattern becomes more complicated, it becomes very difficult to directly measure and adjust the reduction ratio and rotational angle because it involves a large error in measuring the beam size due to an edge roughness.

To deal with the problems, the present invention correctly and easily detects the reduction ratio and rotational angle of a mask pattern, even if the pattern is very fine and has a complicated shape.

Next, a method of detecting and adjusting exposure conditions of a charged particle exposure system according to the present invention will be explained with reference to the drawings.

FIG. 1(A) is a view showing an example of the charged particle exposure system to which the method of detecting and adjusting exposure conditions of the present invention is applied.

The present invention continuously irradiates a plurality of patterns with electron beams while keeping the same reduction ratio and rotational angle for each of the patterns. To realize this, the present invention must calibrate and optimize lens conditions, deflecting ranges, return-deflecting ranges, etc., of an irradiation optical system 1, deflector 55, and an electromagnetic lens of a reduction optical system 10.

In this sort of charged particle exposure system, it is possible to simulate, to some extent, relations between the size and rotational angle of an image and a current flowing to the electromagnetic lens. In actual use, however, the system does not always exactly conform to the result of simulation. It is necessary, therefore, to check the system by actually emitting an electron beam and measuring the size and rotational angle of an image formed by the beam.

For this purpose, a stencil mask 6 according to the present invention has at least two of mark patterns M1, M2, M3, ... shown in FIG. 5. Positional relations of the mark patterns are stored in a proper operation means. These mark patterns must be arranged within a range reachable by a deflected electron beam.

In FIG. 1(A), the deflector 55 comprises incident deflectors 56a and 56b that are arranged above the stencil mask 6 and driven by a deflector driving means 59.

To measure and calibrate the reduction ratio of a pattern and the rotational angle of an image, at least two of the mark patterns M1, M2, M3, ... formed on the stencil mask 6 are used, and the incident deflectors 56a and 56b are driven.

Firstly, the charged particle exposure system is activated, and an electron gun emits an electron beam. A lens 58a passes the electron beam, and the incident deflectors 56a and 56b deflect the electron beam according to proper address information so that the electron beam may irradiate the mark pattern M1 of the stencil mask 6. The electron beam from the mark pattern M1 passes through a lens 58b and forms an image of the mark pattern M1 at a point M1' on the surface 13 of a sample 12 disposed on a stage 11. A path of the electron beam is indicated with a continuous line L1 in the figure. Positional information of the point M1' is read by a known means and stored in a proper memory.

Secondly, the incident deflectors 56a and 56b deflect an electron beam passed through the lens 58a according to other address information, thereby applying the electron beam to the mark pattern M2 of the stencil mask 6. The electron beam from the mark pattern M2 passes through the lens 58b and forms an image of the mark pattern M2 at a point M2' on the surface 13 of the sample 12 disposed on the stage 11. A path of the electron beam is indicated with a dotted line L2 in the figure. Positional information of the point M2' is stored in a proper memory.

To obtain the positional information of the points M1' and M2', a reference point on the stage 11 may be moved to the points M1' and M2' to record the positions thereof as X-Y coordinates. This may accurately be done by using, for example, a laser interferometer.

Figure 1B:
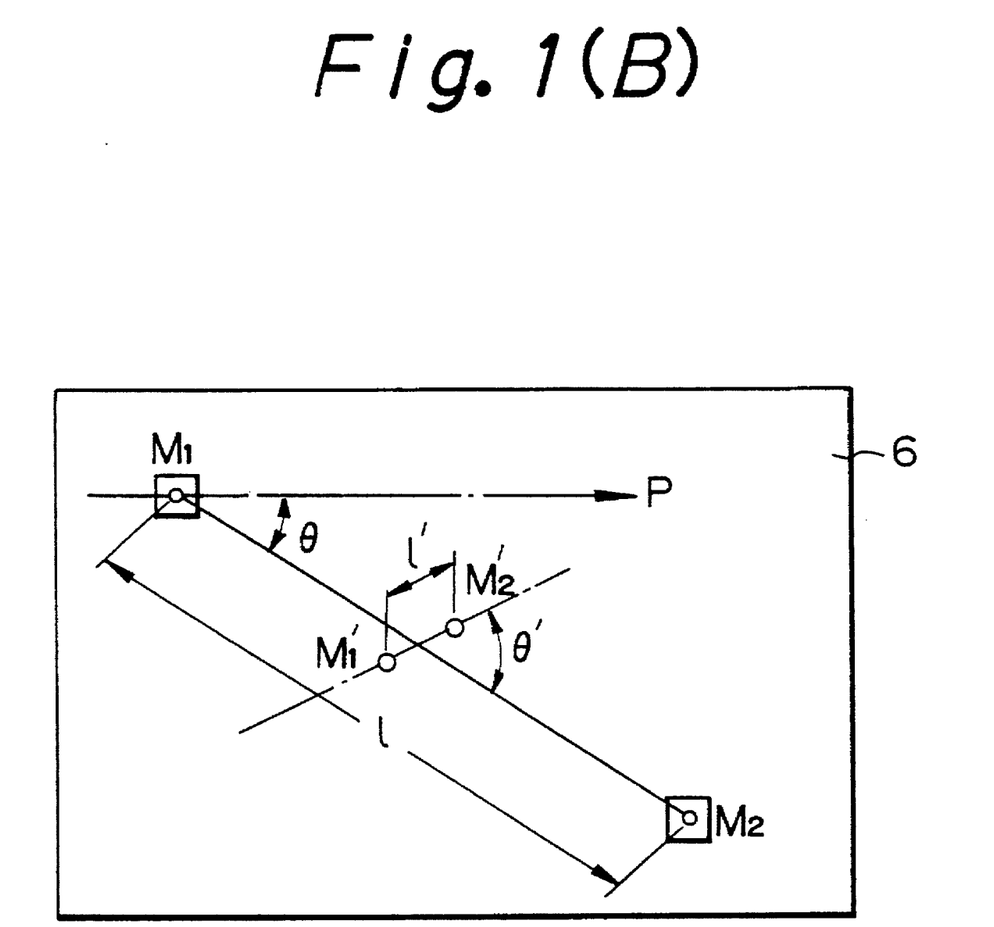
FIG. 1(B) is a view showing positional relations of mark patterns, and reduced images of the mark patterns.

The positional information is provided to a proper processor to compute a distance l' between the points M1' and M2' and a rotational angle θ relative to a reference line P, as shown in FIG. 1(B). Since a distance l between the mark patterns M1 and M2 on the stencil mask 6 is known, a reduction ratio of the reduction optical system 10 may easily be calculated by comparing the distances l and l' with each other. If a rotational angle of the reduction optical system 10 is fixed, the rotational angle may quickly be obtained from the above angle θ. The rotational angle may also be found from an angle formed by a segment between M1 and M2 and a segment between M1' and M2'. According to one practical embodiment of the present invention, the distance between the mark patterns M1 and M2 is, for example, 2.0 mm, and the distance between the points M1' and M2' on the wafer is about 20 μm.

This method can find the reduction ratio and rotational angle of the electromagnetic lens disposed on the wafer side of the stencil mask 6 more accurately than the single rectangular beam method that determines the reduction ratio and rotational angle according to the size and orientation of a single rectangular beam.

In this way, the present invention can correctly detect the reduction ratio and rotational angle. Based on the correct detection, the present invention can adjust and optimize the reduction ratio and rotational angle of the exposure system to prepare the system for actual pattern processing.

If the detected reduction ratio and rotational angle deviate from target values, lens conditions of the reduction optical system 10 are partly or entirely corrected to achieve the target values.

As explained above, when the electron lens (electromagnetic lens) of the reduction optical system of the charged particle exposure system reduces an image of a pattern, the image rotates due to the reduction. It is necessary, therefore, to detect the extent of the image rotation caused by the reduction optical system before positioning the patterns of the stencil mask in the deflector. Based on the detected rotation, the patterns must be arranged angularly. The present invention can easily and correctly find angles of the patterns. In this case, it is possible to rotate the stencil mask by a required angle, or rotate the stage by the required angle, or adjust a current flowing to the electron lens to change the reduction ratio without causing the rotation.

Namely, by arranging a plurality of electron lenses in the reduction optical system, the reduction ratio and rotational angle can be calibrated. The reduction ratio is determined by a combination of actions of the respective lenses. When oppositely flowing currents are applied to two electron lenses, the lenses may reduce an image of a pattern but not rotate the image. A rotational angle of an image is generally proportional to a current flowing to a coil of the lens while a reduction ratio of the image is generally proportional to the square of the current irrespective of the direction of the current. Namely, a value of the current determines the rotation, and the square of the current value determines the reduction ratio. It is possible, therefore, to maintain a constant reduction ratio without causing rotation, by adjusting the current value.

For example, two electron lenses are arranged in series, and oppositely flowing currents of the same magnitude are applied to the lenses. This will not rotate an image of a pattern, and a sum of squared values of the currents determines a reduction ratio of the pattern. In other words, changing the currents flowing to the electron lenses can provide optional reduction ratios and rotational angles.

In this way, currents flowing to the electron lenses are adjusted according to a detected reduction ratio and rotational angle of at least the reduction optical system 10 by using at least two mark patterns. According to the result of the measurement, the present invention calibrates the reduction optical system.

The reduction ratio of the reduction optical system employed by the present invention may usually be about 1/100, though the reduction ratio is not limited to this figure.

In forming an image of a pattern on a substrate such as a wafer, the charged particle exposure system focuses the image to a point X on the stage. Namely, an image of any pattern of the stencil mask must be formed at the point X. If each image is not formed at the point X, complicated patterns will not continuously be formed on the wafer.

Even if the reduction ratio and rotational angle of the reduction optical system are optimized according to the present invention, an image will not correctly be formed at the predetermined position on the wafer, if the deflector disposed on the beam irradiating side of the stencil mask is not properly conditioned. It is necessary, therefore, to measure and judge whether or not the irradiation optical system, reduction optical system, and deflectors of the exposure system are satisfactorily conditioned.

Namely, to effectively use the method of adjusting exposure conditions of the present invention in actual production processes, it is necessary to confirm whether or not the reduction ratio and rotational angle that have been optimized according to the present invention can form an image at a predetermined position on a wafer. How to confirm this will be explained.

Figure 2:
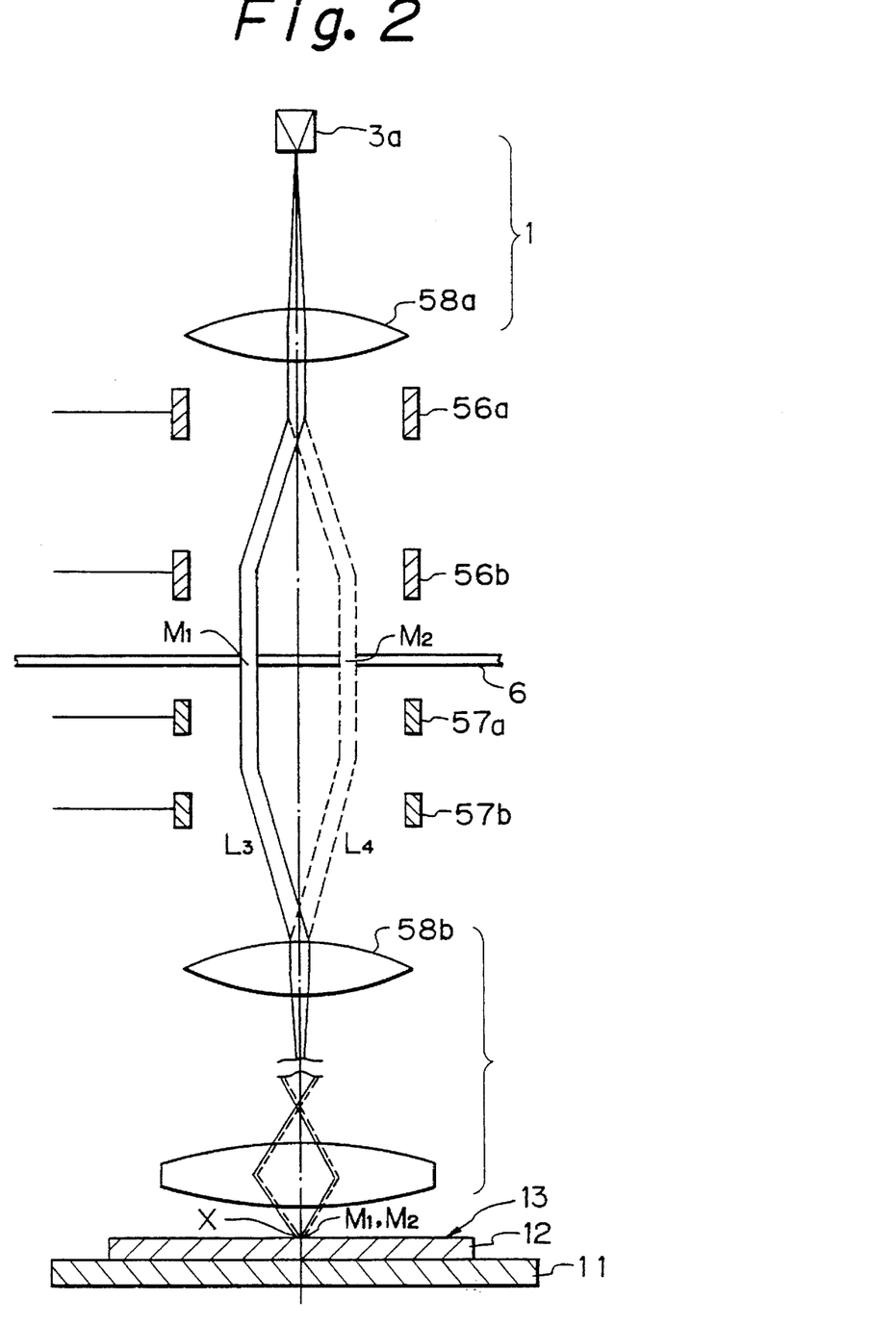
FIG. 2 is a view showing a method of detecting and adjusting exposure conditions of the exposure system according to the present invention.

In FIG. 2, a stencil mask 6 has mark patterns M1 and M2 similar to FIG. 1. There are arranged incident deflectors 56a and 56b and irradiation deflectors 57a and 57b. The deflectors are simultaneously operated to alternately project images of the mark patterns M1 and M2 to a point X on the surface 13 of a sample 12. If the positions of the images on the sample 12 deviate from each other, the deflectors are calibrated by adjusting particularly the irradiation mask deflectors 57a and 57b until the images of both the patterns M1 and M2 form at the same point X on the sample 12. Next, a calibration method will be explained in more detail.

As explained with reference to FIG. 1, proper address information is given to the incident deflectors to deflect and apply an electron beam to the mark pattern M1 formed on the stencil mask 6. The electron beam from the mark pattern M1 is returned to an original optical axis by the irradiation deflectors 57a and 57b that are driven by the driving means 59 (FIG. 4) according to proper address information. The electron beam then passes through a lens 58b and forms an image of the mark pattern M1 at the point X on the surface 13 of the sample 12 disposed on a stage 11. A path of the electron beam is indicated with a continuous line L3.

The same process is carried out for the mark pattern M2. In this case, a path of an electron beam is indicated with a dotted line L4.

If the images of both the patterns M1 and M2 completely overlap one another at the point X, conditions of the exposure system are judged to be normal. It they deviate from each other, conditions of the optical systems and deflectors are calibrated and corrected.

In this way, before actually forming optional patterns on a substrate such as a wafer with the charged particle exposure system, the present invention measures a reduction ratio and rotational angle of at least the reduction optical system 10 by using at least two mark patterns. According to the result of the measurement, the present invention calibrates the reduction optical system to establish a required reduction ratio and rotational angle on the reduction optical system.

The method of detecting and adjusting exposure conditions according to the present invention basically comprises the steps of:

(1) starting the charged particle exposure system;

(2) emitting straight electron beam;

(3) deflecting the electron beam by the incident deflectors (56a, 56b) and passing the beam through a particular one of the mark patterns formed on the stencil mask;

(4) storing the position of an image of the mark pattern transferred onto the surface of the sample by the electron beam;

(5) deflecting an electron beam by the incident deflectors, and passing the beam through another particular one of the mark patterns;

(6) storing the position of an image of the mark pattern transferred onto the surface of the sample by the electron beam;

(7) finding a distance l' between the two images on the sample and an angle θ' relative to a predetermined reference line according to the positional information of the two images found in steps (4) and (6);

(8) finding a distance l between the two mark patterns on the stencil mask according to relative positions of the mark patterns, and finding an angle θ relative to a predetermined reference line;

(9) calculating a reduction ratio (l'/l) and a rotational angle (θ'−θ) according to the distance information l and l' and angular information θ and θ' obtained in steps (7) and (8);

(10) adjusting the reduction optical system having a reduction lens and projection lens, etc., or the deflection lens system, according to the information obtained in step (9);

(11) activating the irradiation deflectors (57a, 57b) of the exposure system, judging whether or not the mark patterns are transferred to the same point on the surface of the sample, and adjusting the deflectors (57a, 57b) if the mark patterns are not transferred to the same point; and (12) starting an actual exposure operation.

Next, the step (10) of adjusting exposure conditions of the reduction optical system to required values will be explained in more detail according to an example.

The block pattern transferring charged particle exposure system of FIG. 1(A) has the reduction optical system 10 that includes the reduction lens 14 and projection lens 24 as shown in FIGS. 3 and 4. In this sort of charged particle exposure system, a cross section of a beam passing through the stencil mask 6 is reduced by the reduction lens 14, and the projection lens 24 forms an image of the beam on the surface of the sample 12. The size of an image formed on the surface of the sample 12 according to a selected block pattern depends on a reduction ratio of the reduction lens 14 and image forming conditions of the projection lens 24.

Figure 6:
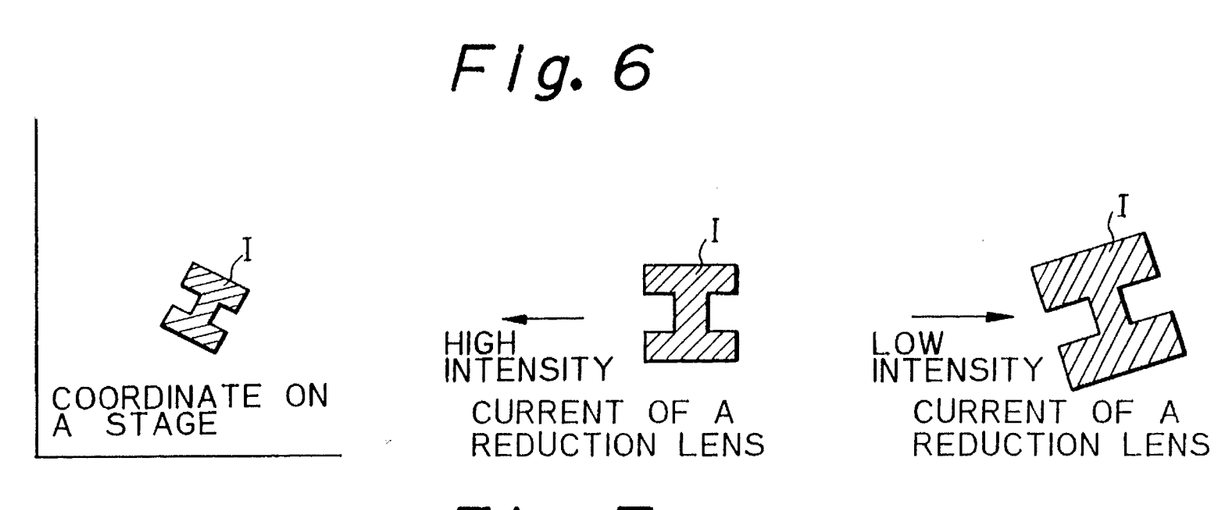
FIG. 6 is a view showing a changes of reduction ratio and rotational angle of a transferred image, relative to the value of a current (the lens power) flowing to a reduction lens in a charged particle exposure system.

The reduction ratio of the reduction lens 14 changes according to a predetermined function as a current flowing to the reduction lens 14, i.e., the power of the lens changes. Namely, as shown in FIG. 6, a transferred image I on the surface of the sample rotates depending on the current flowing to the reduction lens, i.e., the power of the lens.

To adjust the size (reduction ratio) and orientation of the transferred image, it is known to form the reduction lens 14 with at least two lenses 14a and 14b that have exciters that can independently adjust the power of the lenses. With this arrangement, the reduction lens 14 can provide proper power. If any one of the lenses 14a and 14b changes its power, the size and orientation of a transferred image change proportionately. This means that the size of a transferred image cannot be adjusted separately from the orientation of the transferred image. Namely, the reduction lens set to certain lens power provides the transferred image I. When the lens power is increased to strengthen the reduction ratio, the reduction lens provides a transferred image I' rotated in a certain direction compared with the image I. When the lens power is reduced to weaken the reduction ratio, the reduction lens provides a transferred image I" rotated oppositely compared with the above case.

Figure 7:
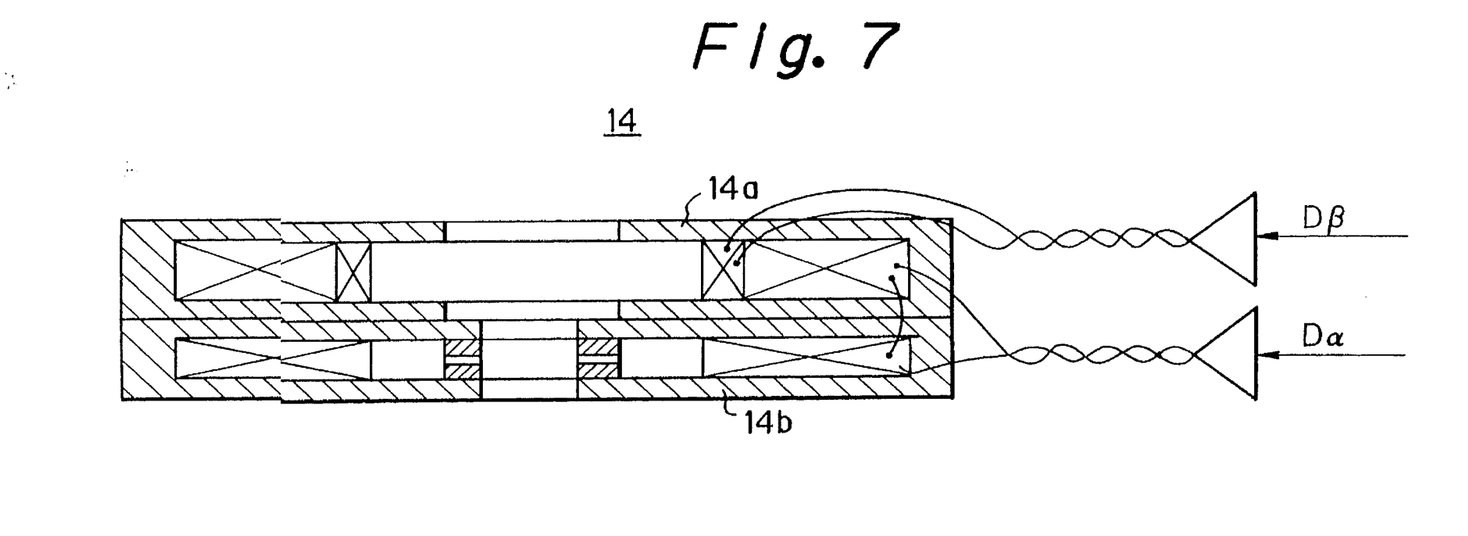
FIG. 7 is a view showing an arrangement of reduction lenses.

According to the present invention, the reduction lens 14 comprises lenses 14a and 14b as shown in FIG. 7. The reduction lens 14b has a first exciter and the reduction lenses 14a has a second exciter, so that the power of the lenses may be independently adjusted.

The reduction lens 14b having the first exciter is controlled according to predetermined data Dα, which is a function that mainly changes a reduction ratio of the lens 14. The reduction lens 14a having the second exciter is controlled according to predetermined data $D\beta$, which is a function that mainly changes a rotational angle of the lens 14. More precisely, the data $D\alpha$ is set to change the overall power of the lenses 14a and 14b without changing a strength ratio of the exciters of the lenses 14a and 14b, and the data $D\beta$ is set to change the strength ratio of the exciters of the lenses 14a and 14b.

Figure 8:
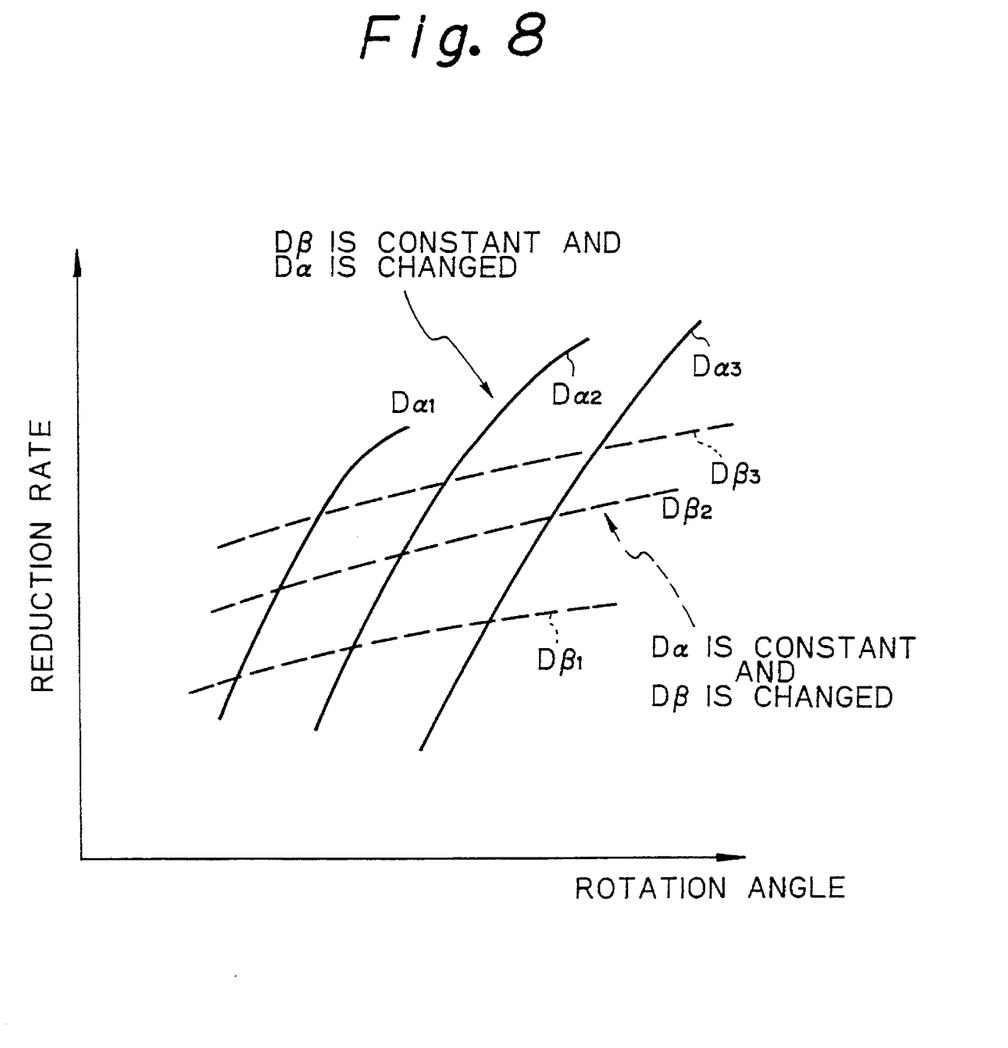
FIG. 8 is a graph showing changes of reduction ratio and rotary angle of a transferred image relative to changes of the power of a lens.

As shown in FIG. 8, when the data $D\beta$ is changed with the data $D\alpha$ being unchanged, the reduction ratio does not change substantially but the rotational angle changes greatly as indicated with dotted lines $D\beta1$ to $D\beta3$. On the other hand, when the data $D\alpha$ is changed with the data $D\beta$ being unchanged, the rotational angle changes slightly and the reduction ratio changes greatly as indicated with continuous lines $D\alpha1$ to $D\alpha3$.

Figure 9:
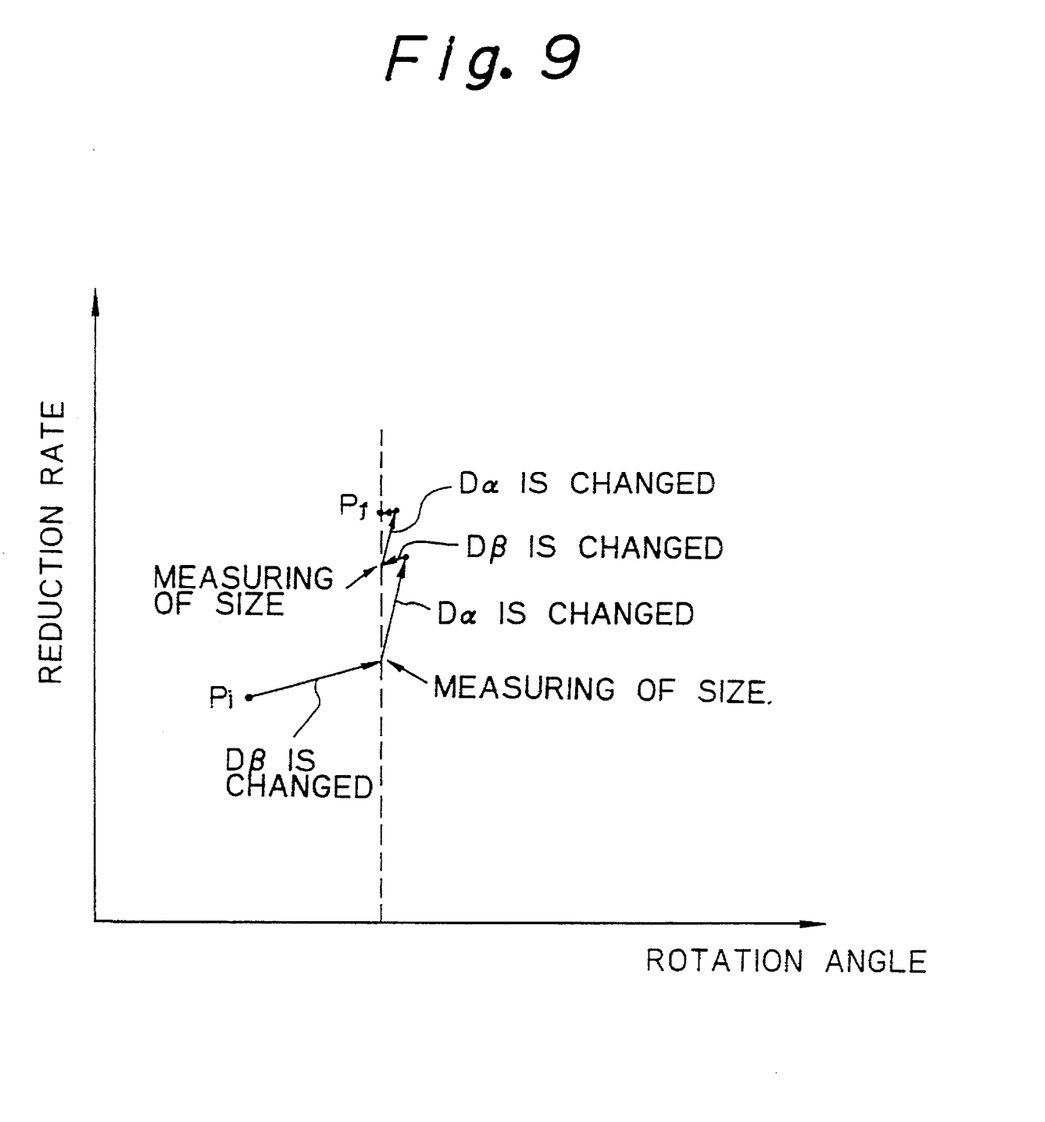
FIG. 9 is a graph showing a sequence of adjusting a reduction ratio and rotational angle of a transferred image according to the present invention.

Similar to FIG. 8, the abscissa of FIG. 9 indicates the rotational angle and the ordinate thereof the reduction ratio. In FIG. 9, a point Pi represents initial exposure conditions of the exposure system. The point Pi will be moved to a point Pf that represents target exposure conditions of the exposure system. Firstly, the data $D\beta$ is changed to realize a required rotational angle on an image transferred to a sample in the exposure system. At this rotational angle, a certain mark edge on the sample is scanned with an electron beam to find the size of the transferred image by measuring a size of the image or a distance between two position on which two marks provided on the mark are irradiated on the surface of the sample. Thereafter, the data Ds is changed to bring the size of the transferred image close to one prescribed by the target conditions Pf. Then, the data $D\beta$ is again changed to bring the orientation of the transferred image close to the required conditions, and the size of the transferred image is again measured. These processes are repeated several times (a definite number of times), thus setting the conditions of the reduction lenses 14a and 14b to be substantially equal to the target conditions Pf. Upon completion of each process, the reduction ratio and rotational angle of the transferred image must be measure and compared with the required values.

A concrete arrangement of the method of adjusting exposure conditions of a charged particle exposure system will be described next.

A reduction optical system of the exposure system includes at least first and second exciters that can separately change the power of lenses, the first exciter mainly changing the overall power of lenses without changing an excitation ratio of the exciters while the second exciter mainly changing the excitation ratio of the exciters. A cycle of adjusting the exposure conditions comprises the steps of:

changing the excitation ratio by operating the second exciter according to the difference between a detected rotational angle and a required rotational angle;

measuring the size of a beam or a distance between shots on the surface of a sample, and finding the difference between the measurement and a reference value;

changing the overall power of lenses without changing the excitation ratio, by operating the first exciter; and measuring the size of a beam or a distance between irradiations on the surface of the sample, and finding the difference between the measurement and the reference value. This adjusting cycle is repeated once or several times. With a simple arrangement of lenses and adjusting sequences for block exposure, the above adjusting cycle can adjust the magnitude and orientation of a transferred image.

As explained above, the present invention can find the reduction ratio of a reduction optical system including electromagnetic lenses disposed on the wafer side of a stencil mask and the rotational angle of an image more precisely than the conventional exposure method that determines the reduction ratio and rotational angle according to the size and beam edge of a single rectangular beam. The present invention separately calibrates the irradiation deflectors 57a and 57b and the incident deflectors 56a and 56b, thereby correctly and easily adjusting the exposure conditions of the reduction optical system.

I claim:

1. A method of detecting exposure conditions of a charged particle exposure system which includes an electron gun that emits charged electron beams along an optical axis, a stage, a stencil mask positioned between the electron gun and the stage and having a surface which traverses the optical axis, an irradiation optical system positioned between the electron gun and the stencil mask, an incident mask deflector positioned between the electron gun and the stencil mask and which deflects electron beams from the optical axis towards the surface of the stencil mask, the electron beams passing through the stencil mask and being directed away from the optical axis after passing through the stencil mask, a reduction optical system positioned between the stencil mask and the stage, and an irradiation deflector positioned between the stencil mask and the stage and which deflects electron beams passing through the stencil mask towards the optical axis, the stencil mask having two mark patterns in a positional relationship, the method comprising the steps of:

(a) operating the incident mask deflector to apply charged electron beams emitted by the electron gun to each of the mark patterns of the stencil mask;

(b) projecting the electron beams passed through the mark patterns onto the surface of the sample through the reduction optical system and undeflected by the irradiation deflector to form images of the mark patterns on the surface of the sample, the images being in a positional relationship;

(c) computing the positional relationship of the images; and (d) comparing the positional relationship of the images with the positional relationship of the mark patterns on the stencil mask, thereby to detect a reduction ratio of the images on the surface of the sample and a rotational angle of the images.

2. A method as set forth in claim 1, wherein the reduction is equal to 1/100.

3. A method of detecting exposure conditions of a charged particle exposure system which includes an electron gun that emits charged electron beams along an optical axis, a stage, a stencil mask positioned between the electron gun and the stage and having a surface which traverses the optical axis, an irradiation optical system positioned between the electron gun and the stencil mask, an incident mask deflector positioned between the electron gun and the stencil mask and which deflects the electron beams from the optical axis towards the surface of the stencil mask, the electron beams passing through the stencil mask and being directed away from the optical axis after passing through the stencil mask, a reduction optical system positioned between the stencil mask and the stage, and an irradiation deflector positioned between the stencil mask and the stage and which deflects electron beams passing through the stencil mask towards the optical axis, the stencil mask having two mark patterns in a positional relationship, the method comprising the steps of:

(a) operating the incident mask deflector to apply charged electron beams emitted by the electron gun to each of the mark patterns of the stencil mask;

(b) projecting the electron beams passed through the mark patterns onto the surface of the sample on the stage through the reduction optical system and undeflected by the irradiation deflector to form images of the mark pattern on the surface of the sample, the images being in a positional relationship;

(c) computing the positional relationship of the images;

(d) comparing the positional relationship of the images with positional relationship of the mark patterns on the stencil mask, and computing a reduction ratio of the images on the surface of the sample and a rotational angle of the images; and (e) adjusting operating conditions of the reduction optical system according to the reduction ratio and rotational angle computed in the preceding step, so that the images of the predetermined patterns projected on the surface of the sample are precisely formed at a desired position.

4. A method as set forth in claim 3, wherein the reduction optical system includes at least first and second exciters that separately change a power of lenses each having a coil, the first exciter changing the overall power of the lenses without changing an excitation ratio of the exciters and the second exciter changing the excitation ratio of the exciters, further comprising the steps of:

changing the excitation ratio by operating the second exciter controlling the coil of the lenses according to a difference between the currently measured value of the reduction ratio and the rotational angle and a required value;

measuring at least one of a size of the beam and a distance between the mark patterns on the surface of the sample to obtain a first measured value, and finding a difference between the first measured value and the required value of the reduction ratio and the rotational angle;

changing the overall power of the lenses without changing the excitation ratio, by operating the first exciter; and measuring at least one of the size of the beam or the distance between the patterns on the surface of the sample to obtain a second measured value, and finding the difference between the second measured value and the required value of the reduction ratio and the rotational angle.

5. A method as set forth in claim 2, wherein the reduction is equal to 1/100.

6. A method of detecting exposure conditions in a charged particle exposure system which includes an electron gun that emits charged electron beams along an optical axis, a stage, a stencil mask positioned between the electron gun and the stage and having a surface which traverses the optical axis, an irradiation optical system positioned between the electron gun and the stencil mask, an incident mask deflector positioned between the electron gun and the stencil mask and which deflects the electron beams from the optical axis towards the surface of the stencil mask, the electron beams passing through the stencil mask and being directed away from the optical axis after passing through the stencil mask, a reduction optical system positioned between the stencil mask and the stage, and an irradiation deflector positioned between the stencil mask and the stage and which deflects electron beams passing through the stencil mask towards the optical axis, the stencil mask having two mark patterns in a positional relationship, with a first distance therebetween and a first line connects the two mark patterns, the method comprising the steps of:

(a) operating the incident mask deflector to apply charged electron beams emitted by the electron gun to the two mark patterns of the stencil mask;

(b) projecting the electron beams, after passing through the two mark patterns, through the reduction optical system and undeflected by the irradiation deflector onto the surface of the sample on the stage to form two images respectively corresponding to the two mark patterns, the two images having a second distance therebetween and a second line connects the images;

(c) computing the second distance and determining the second line; and (d) computing one of the ratio of the first distance to the second distance to detect a reduction ratio of the images on the surface of the sample, and an angle between a first line connecting the at least two of the mark patterns on the stencil mask and the second line to detect a rotational angle of the images.

\* \* \* \* \*

UNITED STATES PATENT AND TRADEMARK OFFICE
CERTIFICATE OF CORRECTION

PATENT NO. : 5,466,549  
DATED : November 14, 1995  
INVENTOR(S) : Akio YAMADA

Page 1 of 3

It is certified that error appears in the above-indentified patent and that said Letters Patent is hereby corrected as shown below:

Drawings:

Delete sheet 7, of Drawings, Fig. 7, and substitute Fig. 7, as shown on per attached sheet.

Column 5, line 44, change "l'" to $-\ell'-$;

line 46, change "l" to $-\ell-$; and line 49, change "l and l'" to $-\ell$ and $\ell'-$.

Column 7, line 53, after ")" insert $-,-$; and line 65, change "l'" to $-\ell'-$.

Column 8, line 6, change "(l'/l)" to $-(\ell'/\ell)-$; and line 7, change "1 and 1'" to $-\ell$ and $\ell'-$.

Signed and Sealed this

Thirteenth Day of August, 1996

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,466,549
DATED : November 14, 1995
INVENTOR(S) : Akio Yamada

It is certified that error appears in the above-indentified patent and that said Letters Patent is hereby corrected as shown below:

Column 9, line 27, change "$D_s$" to --$D_a$--.

Fig. 6

Fig. 7